(12) United States Patent
Lee (10) Patent No.: US 8,120,741 B2
(45) Date of Patent: Feb. 21, 2012

(54) LIQUID CRYSTAL DISPLAY DEVICE

(75) Inventor: Sang Mook Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 235 days.

(21) Appl. No.: 12/482,860

(22) Filed: Jun. 11, 2009

(65) Prior Publication Data

US 2009/0253333 A1     Oct. 8, 2009

Related U.S. Application Data (62) Division of application No. 10/877,361, filed on Jun. 25, 2004, now Pat. No. 7,602,467.

(30) Foreign Application Priority Data

Nov. 21, 2003   (KR) .................. 10-2003-0082949

(51) Int. Cl.
   *G02F 1/1345*   (2006.01)
   *G02F 1/1333*   (2006.01)
(52) U.S. Cl. .......................... 349/149; 349/58
(58) Field of Classification Search .............. 349/58, 349/149–152
See application file for complete search history.

(56) References Cited

U.S. PATENT DOCUMENTS

| | | |
|---|---|---|
| 5,670,994 A | 9/1997 | Kawaguchi et al. |
| 6,587,166 B1 | 7/2003 | Lee et al. |
| 6,590,626 B1 | 7/2003 | Suzuki et al. |
| 6,686,987 B1 | 2/2004 | Sakaki et al. |
| 6,891,582 B2 * | 5/2005 | Hwang ..................... 349/58 |
| 2003/0016328 A1 | 1/2003 | Chung et al. |
| 2004/0017536 A1 | 1/2004 | Takenaka |

FOREIGN PATENT DOCUMENTS

| | | |
|---|---|---|
| JP | 11-174483 | 7/1999 |
| KR | 1020020010313 | 2/2002 |
| KR | 10-2003-0016718 | 3/2003 |

OTHER PUBLICATIONS

Office Action issued in corresponding Korean Patent Application No. 10-2003-0082949, mailed Sep. 30, 2010. 3 pages.
Office Action issued in corresponding Korean Patent Application No. 10-2003-0082949; issued Mar. 29, 2010.

\* cited by examiner

*Primary Examiner* — David Nelms
*Assistant Examiner* — David Chung
(74) *Attorney, Agent, or Firm* — Brinks Hofer Gilson & Lione (57) ABSTRACT

A liquid crystal display includes a display panel, a first data circuit board, a second data circuit board, and a clip. The first data circuit board has a portion of a plurality of conductors that are coupled to the display panel. The second data circuit board has a second plurality of conductors that are coupled to the display panel. A clip couples the first and the second circuit boards together. A method of assembling the liquid crystal display includes positioning a light source; coupling a clip to the first circuit board and the second circuit board that form a display panel; positioning the clip, the first circuit board, and the second circuit board below the light source; and coupling the clip to a ground plane.

5 Claims, 9 Drawing Sheets

LIQUID CRYSTAL DISPLAY DEVICE

RELATED APPLICATIONS

The present patent document is a divisional of U.S. patent application Ser. No. 10/877,361, filed Jun. 25, 2004 now U.S. pat. No. 7,602,467, which claims priority to Korean Patent Application No. P2003-82949 filed on Nov. 21, 2003, which is hereby incorporated by reference.

BACKGROUND

1. Technical Field

This invention relates to displays, and more particularly to, a simplified assembly of a liquid crystal display that has an improved ground plane.

2. Related Art

In general, liquid crystal display modules include a liquid crystal display panel having liquid crystal cells positioned between two substrates. An illuminating unit may be placed behind the liquid crystal display panel to improve clarity and brighten the display panel. Optical sheets may be placed between the illuminating unit and the liquid crystal display to collect and concentrate light against the display to achieve an even greater brightness. To minimize light losses, the optical sheets may form an integral part of the liquid crystal display.

Figure 1:
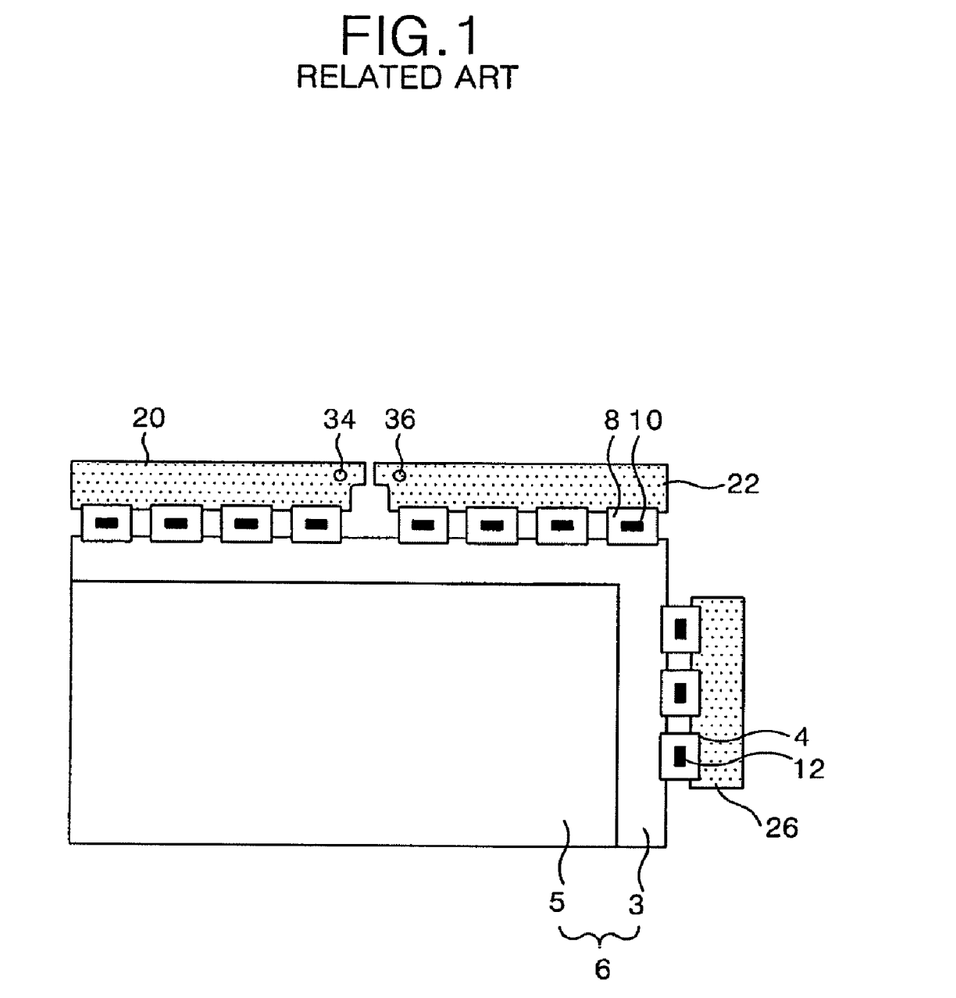
FIG. 1 is a partial plan view of a liquid crystal display in the related art.
Figure 2:
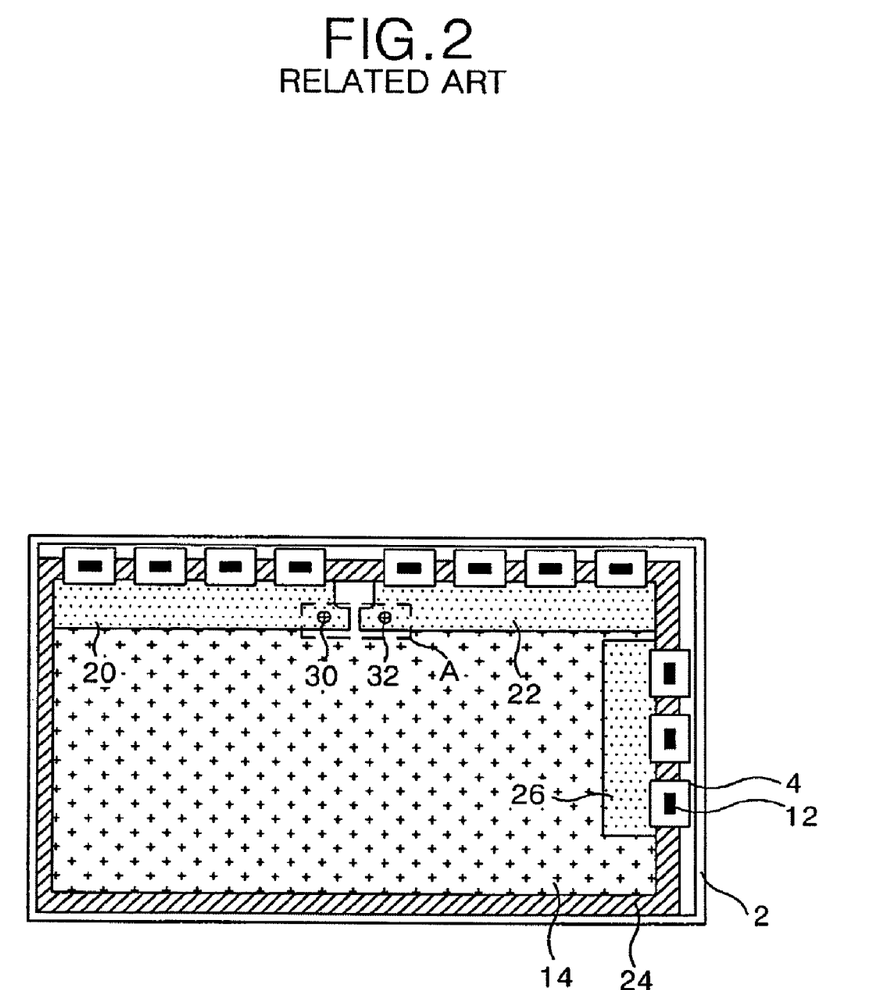
FIG. 2 is a partial rear view of the liquid crystal display of FIG. 1.

FIG. 1 and FIG. 2 illustrate a liquid crystal display module that includes a liquid crystal display panel 6, an inner support 24, and a case 2. The case 2 encloses a portion of the inner support 24 and the liquid crystal display panel 6. An illuminating unit (not shown) having a plurality of lamps is positioned behind the liquid crystal display panel 6. A cover 14 disposed below a plurality of optical sheets receives the light that is spread across its surface.

In FIG. 1, the liquid crystal display 6 is comprised of an upper substrate 5 and a lower substrate 3 separated by a liquid crystal layer. An array of liquid crystals (not shown) injected between the upper and the lower substrates 3 and 5 polarize the light passing through it.

In a matrix display, data lines, gate lines, and other components that are not shown may be formed on the lower substrate 3. A thin film transistor (TFT) in electrical contact with a data and a gate line form one of the many liquid crystal cells that make up the display. The TFT passes data signal to the liquid crystal cell when biased by a scanning pulse (e.g., a gate pulse).

In some matrix displays, a side surface of the lower substrate 3 has data and gate pads. Data circuits 8 mounted to a data drive integrated circuit 10 are electrically linked to the data lines through the data pads. Gate circuits 4 mounted to a gate drive integrated circuit 12 are electrically linked to the gate lines through the gate pads.

As shown in FIG. 2, the first and second circuit boards 20 and 22, and the gate circuit board 26 are positioned proximate to the support 24. In this display, the gate circuit board is secured to the bottom cover with tape and the first and second data circuit boards 20 and 22 are secured to the bottom cover 14 by threaded screws 30 and 32 (See FIG. 3). The screws 30 and 32 pass through first and second holes 34 and 36 of the first and second circuit boards 20 and 22, respectively, before passing through fastening holes formed in the bottom cover 14. The threaded screws 30 and 32 and bottom cover act as a ground plane for the first, second, and gate circuit boards 20, 22, and 26.

Figure 3:
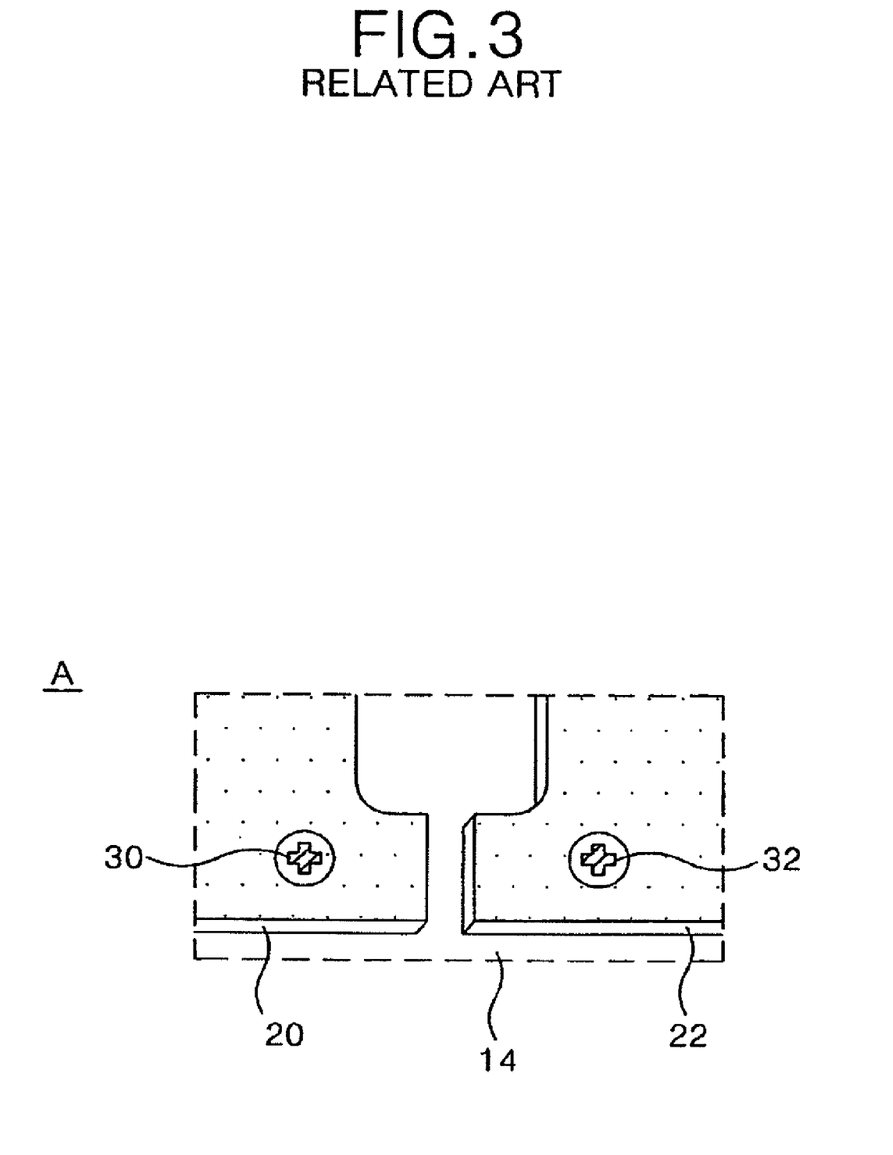
FIG. 3 is a partial cross-sectional view of the liquid crystal display of FIG. 2.

Since the ground plane act as a reference for the voltages in circuit, a weak or intermittent ground may affect the display's performance. If one or more screws 30 and 32 fall out of engagement with the bottom cover 14, the conducting path to ground decreases which may lead to display failure and a loose inner assembly. Moreover in some displays, the multiple screws must first be properly aligned before being evenly and progressively tightened to minimize circuit and board stress in the assembly process. This practice may complicate the assembly process and increases assembly time. The present inventions are directed to an improved display that overcomes some of these potential drawbacks of the related art.

BRIEF SUMMARY

A liquid crystal display comprises a display panel, a first data circuit board, a second data circuit board, and a clip. The first data circuit board supports a portion of a plurality of conductors that are coupled to the display panel. The second data circuit board has a second plurality of conductors that are coupled to the display panel. A clip couples the first and the second circuit boards together.

A method of assembling the liquid crystal display includes positioning a light source; coupling a clip to the first circuit board and the second circuit board that comprise a display panel; positioning the clip, the first circuit board and the second circuit board below the light source; and coupling the clip to a ground plane.

Other systems, methods, features, and advantages of the invention will be, or will become, apparent to one with skill in the art upon examination of the following figures and detailed description. It is intended that all such additional systems, methods, features, and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the inventions. Moreover, in the figures, like referenced numerals designate corresponding parts throughout the different views.

DETAILED DESCRIPTION OF THE DRAWINGS AND THE PRESENTLY PREFERRED EMBODIMENTS

A fastening device may improve the assembly and operation of a display. The fastening device may comprise any device that grips and holds boards or circuits together without threads. The fastening device may engage top surfaces of two or more circuit boards while engaging bottom surfaces of those same circuit boards. The fastening device may improve a display's mechanical durability by increasing the surface area that joins or links the boards or circuits together. The fastening device may improve the displays' electrical durability by increasing the area used to dissipate electrical interference or electrical charge.

Figure 4:
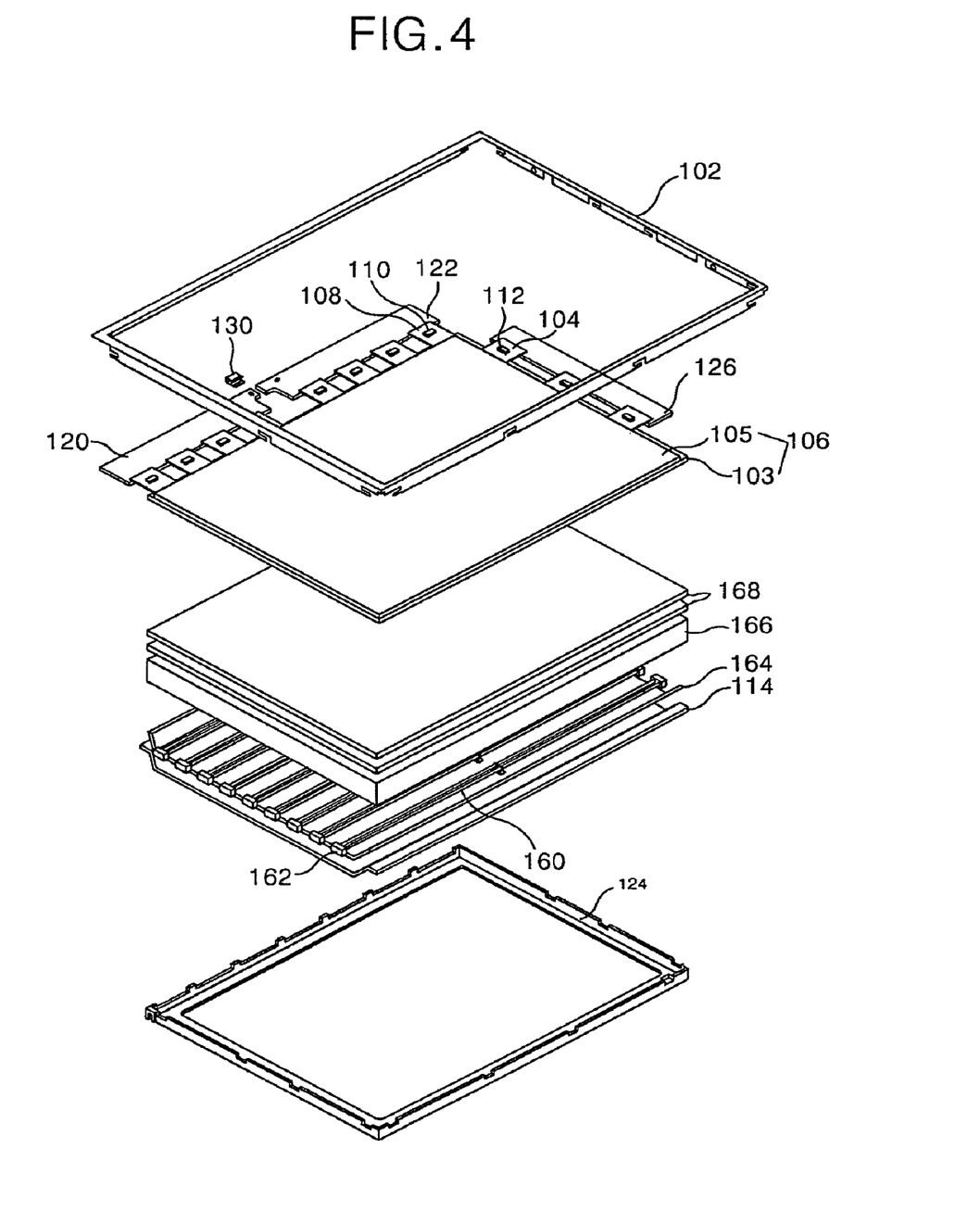
FIG. 4 is an exploded perspective view of a liquid crystal display embodiment.

FIG. 4 is an exploded view of a liquid crystal display embodiment. The liquid crystal display (LCD) includes a support main 124, a backlight unit 160, 162, 164, 166, and 168, a liquid crystal display panel 106, and a case top 102. The case top 102 partially encloses side portions of the support main 124 and the liquid crystal display panel 106. In FIG. 4, the support main 124 is a molded product that may include side cutout portions and/or side projections. A step like ledge or shelf portion of the support main 124 supports the liquid crystal display panel 106 and the backlight unit 160, 162, 164, 166, and 168.

The backlight unit 160, 162, 164, 166, and 168 maybe, for example, an electroluminescent device, light source, or other devices that convert electrical energy into light such as a plurality of lamps 160. The plurality of lamps 160 maybe, for example, cold cathode florescent light sources held in place by a plurality of lamp holders 162. A medium spreads or scatters light onto the liquid crystal display panel 106. In FIG. 4, the medium comprises a diffuser 166 that is proximate to a plurality of optical sheets 168. The optical sheets 168 are disposed between the diffuser 166 and the liquid crystal display panel 106 to collect and direct light to the liquid crystal display panel 106.

Each of the plurality of lamps 160 may be comprised of inactive gases or vapors. The inactive gasses or vapors may fill the interior of the light sources and may have an inner wall coated with a material that fluoresces (e.g., a phosphorous material) when an electrical current passes through or near it. In the embodiment shown in FIG. 4, the plurality of lamps have a substantially cylindrical shape that couple a plurality of lamp holders 162 at side edges. In all uses, herein, the term substantially, includes an exact shape or dimension as well as shapes and dimensions near that which is described that do not appreciably affect the element or its function. The term couple or coupled, in all uses, herein, is intended to encompass both direct and indirect coupling. Thus, a lamp and a lamp holder are said to be coupled together when they are in direct contact, as well as when the lamp couples an intermediate part which couples the lamp holder directly or via one or more additional parts.

A bottom cover 114 is positioned behind the plurality of lamps 160 arranged behind the plurality of lamps 162 and lamp holders 160 on a lowermost layer of the support main 124. In this embodiment, side edges of the bottom cover 114 have an inclined face configured to reflect light from edge areas of the bottom cover 114 to the upper surfaces of the liquid crystal display panel 106. A reflecting sheet 164 reflects light from the plurality of lamps 160 back toward the upper surfaces of the liquid crystal display panel 106. The reflecting sheet 164 increases the amount of light that is incident to the liquid crystal display panel 106 while minimizing the light lost through the bottom cover 114.

A diffuser 166 that collects and spreads light across the optical sheets 168 is positioned above the plurality of lamps 160. The diffuser 106 may comprise, for example, a light-diffusing material coated onto one or more sides of a film, which may be a transparent resin or an acrylic. A plurality of optical sheets 168 disposed between the diffuser 166 and the liquid crystal display panel 106 collects light exiting the diffuser 166 and adjusts the direction of the light such that light exits from the optical sheets 168 in a substantially perpendicular direction to a surface of the liquid crystal display panel 106. The optical sheets improve the efficiency of the light impinging on the liquid crystal display panel 106.

In FIG. 4, the liquid crystal display panel 106 is comprised of an upper substrate 105 and a lower substrate 103 separated by a spacer (not shown). A liquid compound (not shown) or liquid crystal layer (not shown) having a polar molecular structure is positioned between the upper and the lower substrates 103 and 105 that polarize the light passing through it when an electric field is applied. A multi-color filter (not shown) may be disposed on the upper substrate 105 of the liquid crystal display panel 106 to generate color. The multi-color filter may include a black matrix, films containing three primary colors, dyes or pigments, and other components.

In the embodiment shown in FIG. 4, data lines, gate lines, and other components (not shown) may be disposed on the lower substrate 103. A thin film switch, such as a thin film transistor (TFT) in electrical contact with a data line and a gate line may form one of many liquid crystal cells that comprise the liquid crystal display panel 106. The switches or TFTs pass data signals to the liquid crystal cell when biased by a scanning pulse (e.g., a gate pulse). A pixel electrode may be formed at a pixel area between a data line a gate line.

In some embodiments, a side surface of the lower substrate 103 supports data and gate pads. A plurality of data tape carrier packages (TCP's) 108 electrically couple a data drive integrated circuit 110 through the data lines and data pads. A plurality of gate TCP's 104 electrically couple a gate drive integrated circuit 112 through gate lines and gate pads. In these embodiments, the data tape carrier packages (TCP's) 108 may be distributed across two or more circuit boards as shown in FIG. 5.

Figure 5:
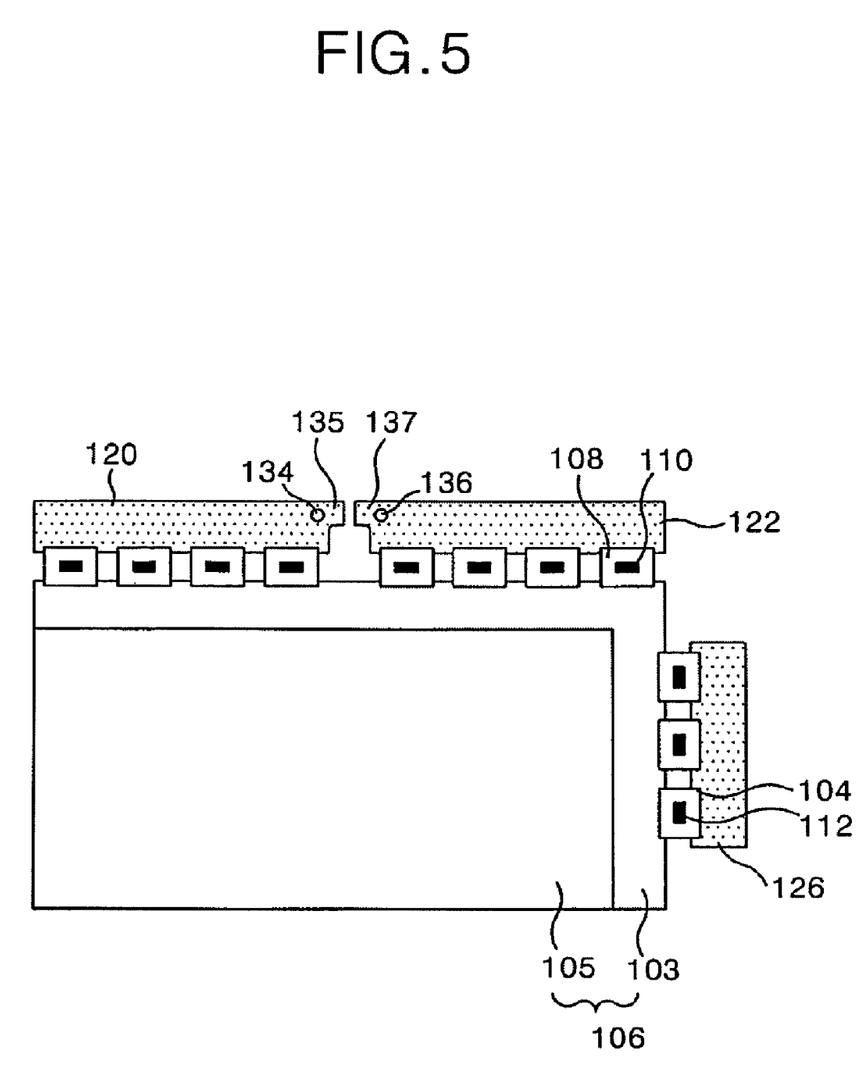
FIG. 5 is a partial plan view of the liquid crystal display embodiment of FIG. 4.

As FIG. 5 illustrates, two insulated boards or printed circuit boards (PCB) such as a first and a second circuit board 120 and 122 interconnect the plurality of data TCPs 108. Although the embodiment encompasses any circuit layout and/or distribution, FIG. 3 illustrates half of the data TCPs 108 interconnected on the first circuit board 120 and half of the data TCPs 108 interconnected on a second circuit board 122. An adhesive secures the gate circuit board 126 to the bottom cover 114. The adhesive may comprise a single or double-face tape, a resin, or other materials that tend to adhere to a surface.

In FIG. 5, the first and second circuit boards 120 and 122 are isometric and are formed generally like a rectangle. A step-like cut out portion forms a protruding edge or first extending part 135 that is proximate to an almost equally dimensioned second protruding edge or second extending part 137. A pair of openings or first and second apertures 134 and 136 are spaced apart from the respective first and second extending parts 135 and 137 away from the data TCPs 108.

Figure 6:
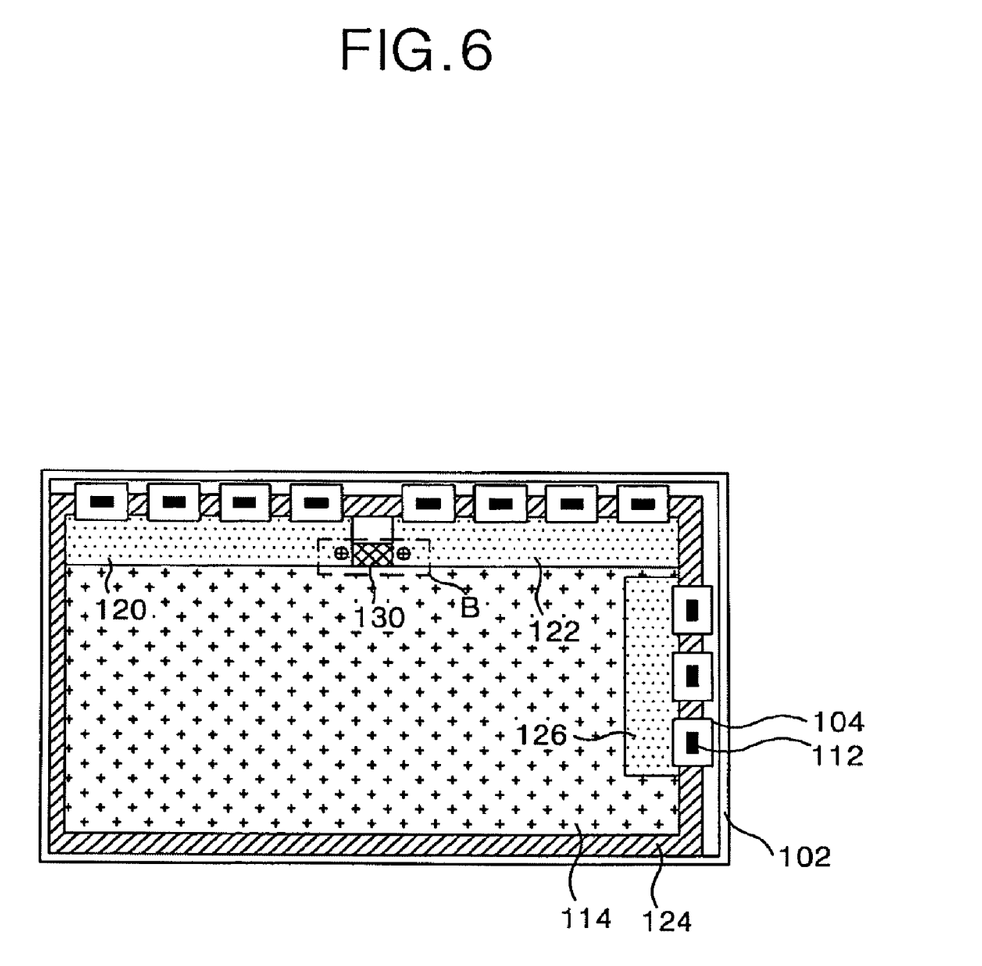
FIG. 6 is a rear view of the liquid crystal display embodiment of FIG. 4.

As shown in FIG. 5, a side edge of the first extending part 135 lies near a side edge of the second extending part 137. During assembly, the first and second data circuit boards 120 and 122 and the gate circuit boards 126 are folded toward a lower surface of the support main 124 as shown in FIG. 6. In this embodiment, a shield is disposed between the bottom cover 114 and the first, second, and gate circuit boards 120, 122, and 126. The shield, which may comprise any material that is a poor conductor of electricity, may be fastened to the bottom cover 114 by a fastener such as a screw.

Figure 7:
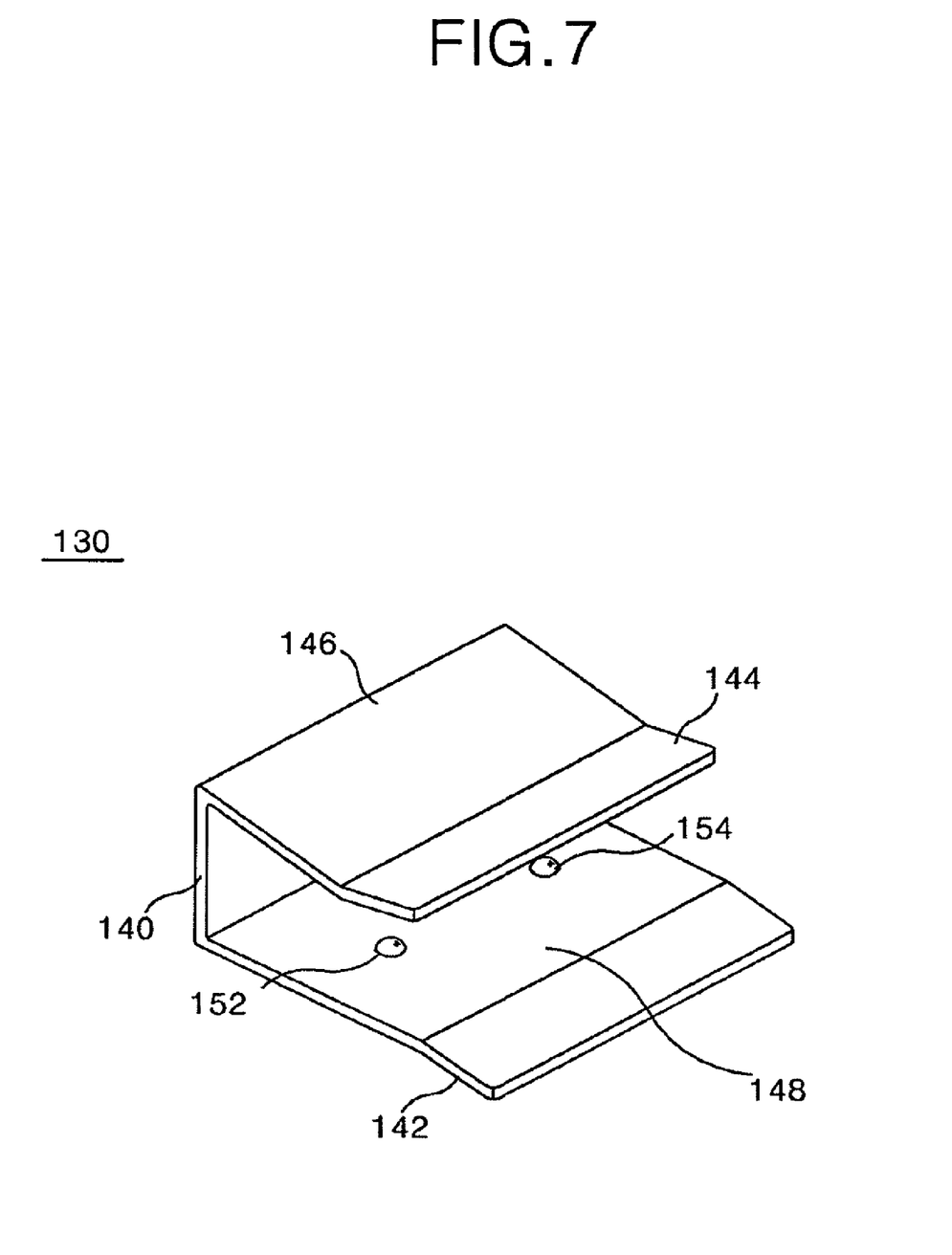
FIG. 7 is a perspective view of a clip shown in FIG. 4.

As shown in FIG. 7, a clip 130 includes a bottom plate 148 and a side wall 140. The bottom plate 148 lies in a plane that is substantially perpendicular to the plane of the side wall 140. A top plate 146 that is formed in a plane which is substantially parallel with and across from the plane of the bottom plane 148 is substantially perpendicular to the plane of the side wall 140. In embodiment of FIG. 7, the side wall 140 is equal to or greater in length than widths of the first and/or second circuit boards 120 and 122, but may be shorter in length than the lengths of top and/or bottom plates 146 and 148 of the clip 130. Moreover, the length of the top plate 146 may be substantially equal to or shorter in length than the length of the bottom plate 148.

The bottom plate may further include protrusions that extend away from the plane of the bottom plate 146. The protrusions may take any shape such the first and second spherical protrusions 152 and 154 shown in FIG. 7 and may project away from the bottom plate 148 toward the top plate 146. Moreover, although a plane of symmetry (not shown) may divide the spherical protrusions 152 and 154 shown in FIG. 7, the protrusions may be spaced apart in many other configurations. The clip 130 may be formed from any conducting material such as a metal or a combination of conducting and non-conducting materials and may take any shape like the substantially "U" shape shown in FIG. 7.

Figure 8:
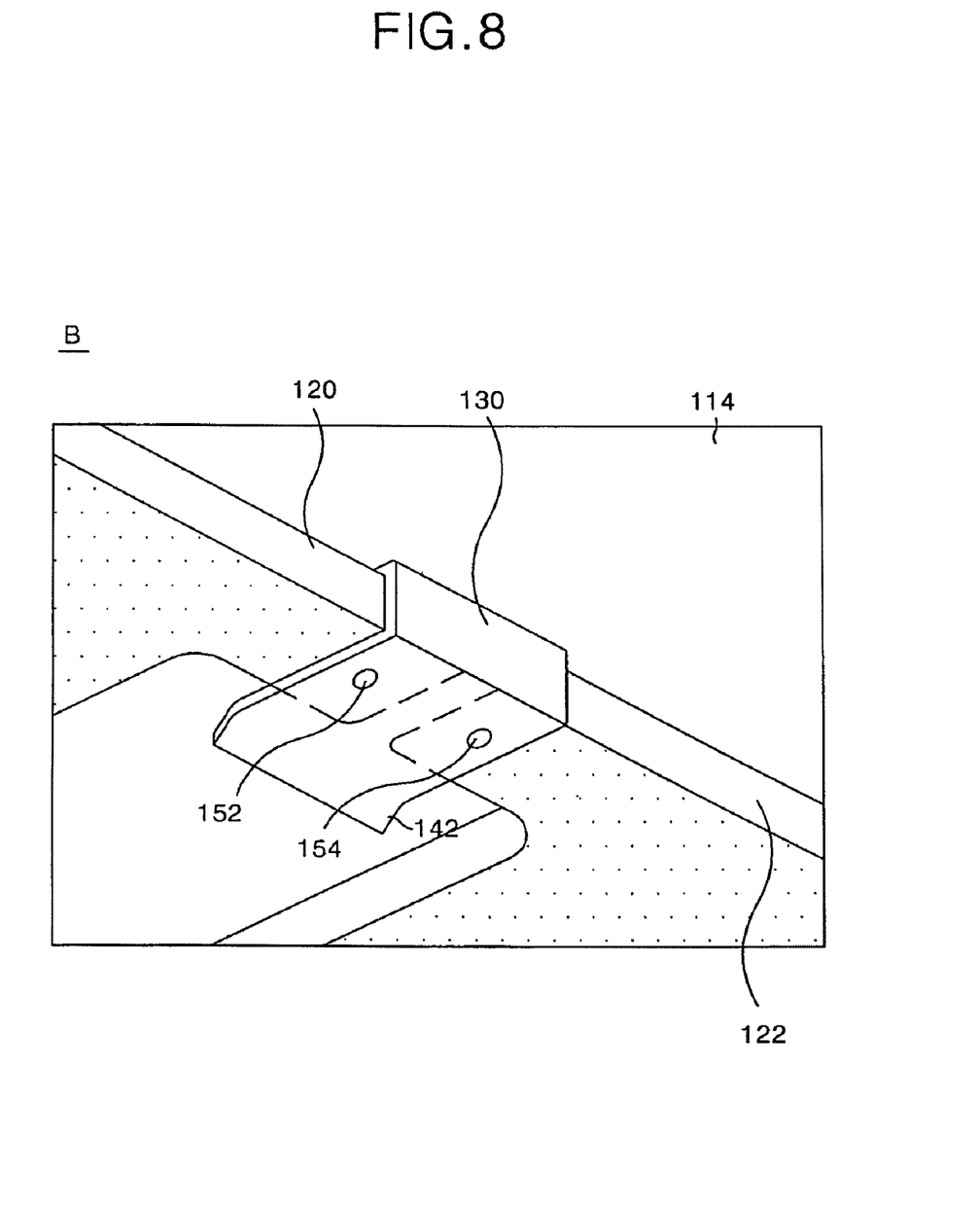
FIG. 8 is a perspective view of the clip shown in FIG. 4.

As further shown in FIG. 7, the clip 130 also includes a first and a second flange or bending part 142 and 144. The slope of the first bending part 142 descends from the ascending slope of the of the bottom plate 148. The slope of the second bending part 144 ascends from the descending slope of the top plate 146. These slopes of the bending parts 142 and 144 are configured to receive a width of the first and second circuit boards 120 and 122. When a liquid crystal display embodiment is assembled, the first bending part 142 is in contact with an upper side surface of the first and second printed circuit boards 120 and 122, while the second bending part 144 is in contact with the rear side surface of the bottom cover 114. The first spherical protrusion 152 may then be received into the first aperture 134 while the second spherical protrusion 154 may be received into the second aperture 136 as shown in FIG. 8. The engagement of the spherical protrusions 152 and 154 and apertures 134 and 136 may be dimensioned to resist some relative motion while allowing for the expansion and contraction of the first and second circuit boards 152 and 154 that may occur during use.

When fully assembled, the clip 130 grips and holds the first and second extending parts 135 and 137 of the respective first and second printed circuit boards 120 and 122 which are grounded to the bottom cover 114 by contact. In one embodiment, the first and second printed circuit boards 120 and 122 are inserted between the top and bottom plates 146 and 148 of the clip 130, respectively, until the first and second spherical protrusions 152 and 154 formed on the bottom plate 148 are received by the first and second openings or apertures 134 and 136 shown in FIG. 5. The clip 130 may act like a friction grip that may resist some relative motions caused by an external force while allowing for board expansion or contraction that may occur during the display's use. The clip 130 also maintains a common ground or ground potential between the first and second circuit boards 120 and 122 and the ground plane which may include the bottom cover 114.

Figure 9:
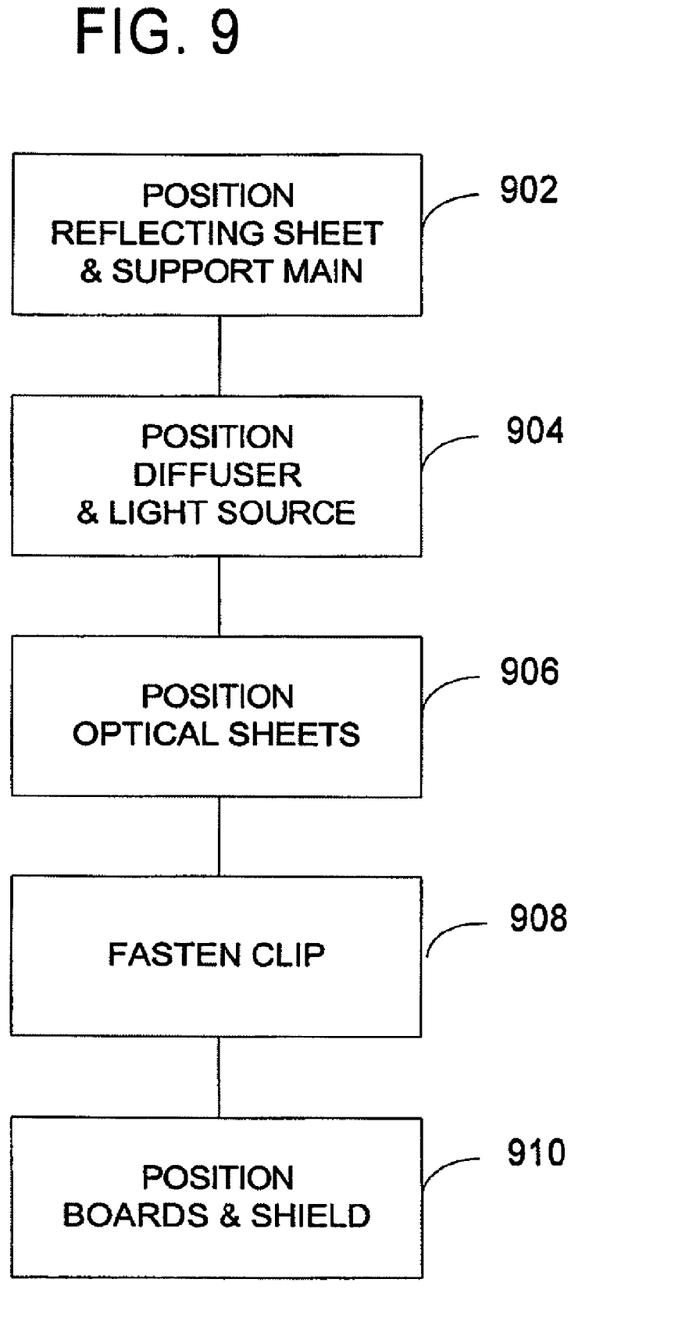
FIG. 9 is a flow diagram of an assembly of a liquid crystal display embodiment.

To assemble an embodiment of a liquid crystal display, the bottom cover 114 is positioned between the reflecting sheet 164 and the support main 124 at act 902 of FIG. 9. The reflecting sheet 164 reflects light from an electroluminescent display or a plurality of lamps 160 that is disposed between a diffuser 166 and the reflecting sheet 164 at act 904. The reflecting sheet 164 may increase the amount of light that is incident to the liquid crystal display panel 106 while minimizing the light lost through the bottom cover 114. A diffuser 166 is positioned between one or more optical sheets 168 and the electroluminescent display or a plurality of lamps 160 at act 906. The optical sheets 168 collect and/or direct light toward the liquid crystal display panel 106.

During assembly, portions of the first and second printed circuit boards 120 and 122 that form part of the liquid crystal display panel 106 are inserted between the top and bottom plates 146 and 148 of the clip 130, respectively at act 908. A coupling force biases the clip 106 until the first and second spherical protrusions 152 and 154 formed on the bottom plate 148 of the clip 106 are received by the first and second openings or apertures 134 and 136 formed in the first and second circuit boards 120 and 122. The clip 130 may act like a friction grip that may resist some relative motions caused by external forces while allowing for board expansion or contraction that may occur during the display's use. The first and second data circuit boards 120 and 122 and the gate circuit boards 126 are then folded toward a lower surface of the support main 124 allowing the clip 130 to couple a common ground plane that may be linked to the bottom cover 114 by a direct contact at act 910. At act 910, a shield may also be positioned between the bottom cover 114 and the first, second, and gate circuit boards 120, 122, and 126. At act 912, the case top 102 is positioned to partially enclose the support main 124 and the liquid crystal display panel 106.

The invention is not limited to the particular circuit board shapes or clip mechanisms described above. Any elastic or inelastic shape and suitable thread-less fastening device may be used to fasten and/or ground the circuit boards together. For example, the protrusions formed on the clip 130 may be integrally formed with or separately formed and attached or functionally attached to the circuit boards. In these embodiments, the circuit boards may not have the apertures such as those that may be formed in a first and a second extending part. Furthermore, some clips may not use protruding elements to grip and hold the boards together. In some of these alternative embodiments, a friction fit may be sufficient to hold or couple the boards together and link the boards to ground with or without the apertures. In some other alternative embodiments a clip may engage or couple at least top and bottom surfaces of at least a first and a second circuit board. In another alternative embodiment, one or more thin films may supply data and/or gate pulses to the liquid crystal display. In these embodiments, a clip would grip the films and provide a conducting path to ground.

In the liquid crystal display embodiments described above, a thread-less fastening member may improve the assembly and operation of the display. In some of these embodiments, an elastic clip secures a first and second data circuit boards, which may comprise printed data circuit boards, to a grounded surface. In these embodiments, the liquid crystal display may be easily assembled by simply aligning the edges of multiple circuit boards and then sliding a clip across the extending parts of those boards. By this simple sliding of a clip across a portion of the multiple circuit boards, the assembly process is simplified, which lowers assembly time and increases assembly efficiency. The fastening device may also improve the operation of the display by increasing the conducting path to ground while also improving the display's mechanical durability by increasing the surface area that joins and holds the circuit boards or circuits together.

While various embodiments of the invention have been described above, it will be apparent to those of ordinary skill in the art that many more embodiments and implementations are possible and within the scope of the invention. Accordingly, the invention is not to be restricted except in light of the claims and their equivalents.

The invention claimed is:

1. A method of assembling a display comprising;

positioning a light source and display panel;

connecting a plurality of conductors to the display panel, wherein the plurality of conductors are mounted with a driving circuit supplying data to the display panel;

connecting a first circuit board to one conductors among the plurality of conductors;

connecting a second data printed circuit board to the other conductors except the one conductors;

coupling a clip to a first circuit board and a second circuit board;

positioning the clip, the first circuit board, and the second circuit board below the light source, wherein the clip is laterally coupled to the first and second circuit boards to hold the first and second circuit boards together on a same plane; and coupling the clip to a ground plane, wherein the clip electrically connects a ground plane of the first circuit board to a ground plane of the second circuit board;

wherein the clip comprises;

1) a bottom plate;

2) a side wall extended perpendicularly from one side of the bottom plate;

3) a top plate extended from the upper portion of the side wall in such a manner to be opposite to the bottom plate; and wherein the first and second circuit boards are inserted in space between the bottom plate and the top plate.

2. The method of claim 1 where the display panel comprises a liquid crystal display panel.

3. The method of claim 1 where the clip further comprises a plurality of protrusions that protruded from the bottom plate towards the top plate.

4. The method of claim 3 where the clip further comprises a bending part having a slope that diverges from the slope of the bottom plate.

5. The method of claim 4 where the slope of the bending part descends from an ascending slope of the bottom plate.

* * * * *